(12) United States Patent
Jang et al.

(10) Patent No.: US 9,041,443 B2
(45) Date of Patent: May 26, 2015

(54) DIGITAL PHASE-LOCKED LOOP USING PHASE-TO-DIGITAL CONVERTER, METHOD OF OPERATING THE SAME, AND DEVICES INCLUDING THE SAME

(71) Applicants: Tae Kwang Jang, Hwaseong-si (KR); Jenlung Liu, Seoul (KR); Nan Xing, Seoul (KR); Jae Jin Park, Seongnam-si (KR)

(72) Inventors: Tae Kwang Jang, Hwaseong-si (KR); Jenlung Liu, Seoul (KR); Nan Xing, Seoul (KR); Jae Jin Park, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/182,812

(22) Filed: Feb. 18, 2014

(65) Prior Publication Data
US 2014/0266341 A1 Sep. 18, 2014

(30) Foreign Application Priority Data
Mar. 15, 2013 (KR) .......................... 10-2013-0028321

(51) Int. Cl.
*H03L 7/06* (2006.01)
*H03L 7/085* (2006.01)

(52) U.S. Cl.
CPC ........................................ *H03L 7/085* (2013.01)

(58) Field of Classification Search
USPC .................................................. 327/147, 156
See application file for complete search history.

(56) References Cited

U.S. PATENT DOCUMENTS

| 7,583,152 | B2 | 9/2009 | Zhang |
| 7,715,515 | B2 | 5/2010 | Olsson et al. |
| 7,759,993 | B2 | 7/2010 | Zhang |
| 7,868,672 | B2 | 1/2011 | Geng et al. |
| 7,940,098 | B1 | 5/2011 | Kwasniewski et al. |
| 8,076,960 | B2 | 12/2011 | Geng et al. |
| 8,203,369 | B2 | 6/2012 | van de Beek |
| 8,390,347 | B1 * | 3/2013 | Sinha et al. ............... 327/156 |
| 8,581,759 | B2 * | 11/2013 | Booth et al. ............... 341/111 |
| 2008/0111597 | A1 | 5/2008 | Cranford et al. |
| 2011/0090998 | A1 | 4/2011 | Zhang |
| 2011/0316595 | A1 * | 12/2011 | Bolton ...................... 327/156 |
| 2012/0112841 | A1 | 5/2012 | Hayashi |
| 2012/0201338 | A1 * | 8/2012 | Leung et al. .............. 375/376 |
| 2013/0027102 | A1 * | 1/2013 | Chen et al. ................ 327/158 |
| 2013/0147531 | A1 * | 6/2013 | Lee et al. .................. 327/158 |
| 2013/0169457 | A1 * | 7/2013 | Heli et al. ................. 341/120 |
| 2014/0021987 | A1 * | 1/2014 | Okada ....................... 327/156 |
| 2014/0266341 | A1 * | 9/2014 | Jang et al. ................. 327/156 |

FOREIGN PATENT DOCUMENTS

KR 10-2005-0094180 A 9/2005

* cited by examiner

*Primary Examiner* — Adam Houston
(74) *Attorney, Agent, or Firm* — Sughrue Mion, PLLC

(57) ABSTRACT

A digital phase locked loop (DPLL), a method of operating the same, and a device including the same are provided. The DPLL includes a digitally-controlled oscillator configured to change a frequency and a phase of an output oscillation signal in response to a digital control code; a main divider configured to divide the frequency of the output oscillation signal and generate a first feedback signal based on the divided frequency; and a phase-to-digital converter configured to subdivide the phase of the output oscillation signal and to generate a quantized code by converting a phase difference between a reference signal and the first feedback signal using a phase-subdivided signal resulting from the subdivision. The digital control code is generated based on the quantized code.

19 Claims, 14 Drawing Sheets

DIGITAL PHASE-LOCKED LOOP USING PHASE-TO-DIGITAL CONVERTER, METHOD OF OPERATING THE SAME, AND DEVICES INCLUDING THE SAME

CROSS-REFERENCE TO RELATED APPLICATIONS

This application claims priority from Korean Patent Application No. 10-2013-0028321 filed on 15 Mar. 2013, the disclosure of which is hereby incorporated by reference in its entirety.

BACKGROUND

Devices, methods, and articles of manufacture consistent with exemplary embodiments relate to an electronic circuit, and more particularly, to a digital phase-locked loop (DPLL), devices including the same, and a method of operating the same.

Phase-locked loops (PLLs) are usually used to generate a clock signal having a particular frequency. PLLs are divided into analog PLLs and digital PLLs. A DPLL has advantages of easy scaling and a small area but has disadvantages of high in-band noise and many spurious tones.

SUMMARY

According to an aspect of an exemplary embodiment, there is provided a digital phase locked loop (DPLL) circuit including a digitally-controlled oscillator configured to change a frequency and a phase of an output oscillation signal in response to a digital control code; a main divider configured to divide the frequency of the output oscillation signal and generate a first feedback signal based on the divided frequency; and a phase-to-digital converter configured to subdivide the phase of the output oscillation signal and to generate a quantized code by converting a phase difference between a reference signal and the first feedback signal using a phase-subdivided signal resulting from the subdivision. The digital control code may be generated based on the quantized code.

The phase-to-digital converter may include a phase interpolator configured to subdivide the phase of the output oscillation signal and generate a plurality of output phase signals having a different phase from each other; a phase quantizer configured to count at least one of a rising edge and a falling edge of each of the output phase signals in response to a quantizer control signal and to generate the quantized code based on a count value resulting from the counting; and a deadzone-free phase-frequency detector configured to generate the quantizer control signal for controlling an operation of the phase quantizer.

The phase quantizer may include a plurality of counters each configured to count edges of one of the output phase signals between an edge of a second feedback signal and an edge of the reference signal; an adder configured to calculate an added count value by adding up outputs of the respective counters; and a differentiator configured to generate the quantized code by calculating a difference between the added count value and a reference count value. The second feedback signal may have a first phase difference from the first feedback signal.

The DPLL may further include a digital loop filter configured to receive and filter the quantized code; and a digital code generator configured to generate the digital control code based on an output signal of the digital loop filter.

According to another aspect of an exemplary embodiment, there is provided a method of operating a DPLL. The method includes generating a first feedback signal by dividing a frequency of an output oscillation signal; generating phase-subdivided output signals by subdividing a phase of the output oscillation signal; generating a quantized code by converting a phase difference between a reference signal and the first feedback signal using a phase-subdivided output signal; generating a digital control code based on the quantized code; and changing the frequency and the phase of the output oscillation signal based on the digital control code.

The method may further include generating a second feedback signal that has a same frequency as the first feedback signal and has a first phase difference from the first feedback signal. The generating the quantized code may include calculating a phase difference between the second feedback signal and the reference signal; and calculating the phase difference between the reference signal and the first feedback signal using the phase difference between the second feedback signal and the reference signal and the first phase difference.

The generating the phase-subdivided output signals may include interpolating the phase of the output oscillation signal.

The calculating the phase difference between the second feedback signal and the reference signal may include counting at least one of a rising edge and a falling edge of each of the phase-interpolated output signals in response to a quantizer control signal, which is enabled in response to the second feedback signal and is disabled in response to the reference signal, adding the counts of each of the phase-interpolated output signals to produce an added count value, and outputting the added count value.

According to another aspect of an exemplary embodiment, there is provided a system on chip (SoC) including a DPLL and an application processor configured to operate in response to a clock signal generated based on an output oscillation signal of the DPLL. The DPLL includes a digitally-controlled oscillator configured to change a frequency and a phase of an output oscillation signal in response to a digital control code; a main divider configured to divide the frequency of the output oscillation signal and generate a first feedback signal; and a phase-to-digital converter configured to subdivide the phase of the output oscillation signal and to generate a quantized code by converting a phase difference between a reference signal and the first feedback signal using a phase-subdivided signal resulting from the subdivision. The digital control code may be generated based on the quantized code.

The phase-to-digital converter may include a phase interpolator configured to subdivide the phase of the output oscillation signal and generate a plurality of output phase signals having a different phase from each other; a phase quantizer configured to count at least one of a rising edge and a falling edge of each of the output phase signals in response to a quantizer control signal and to generate the quantized code based on a count value resulting from the counting; and a deadzone-free phase-frequency detector configured to generate the quantizer control signal for controlling an operation of the phase quantizer.

BRIEF DESCRIPTION OF THE DRAWINGS

The above and other aspects will become more apparent by describing in detail exemplary embodiments with reference to the attached drawings in which.

DETAILED DESCRIPTION

Figure 1:
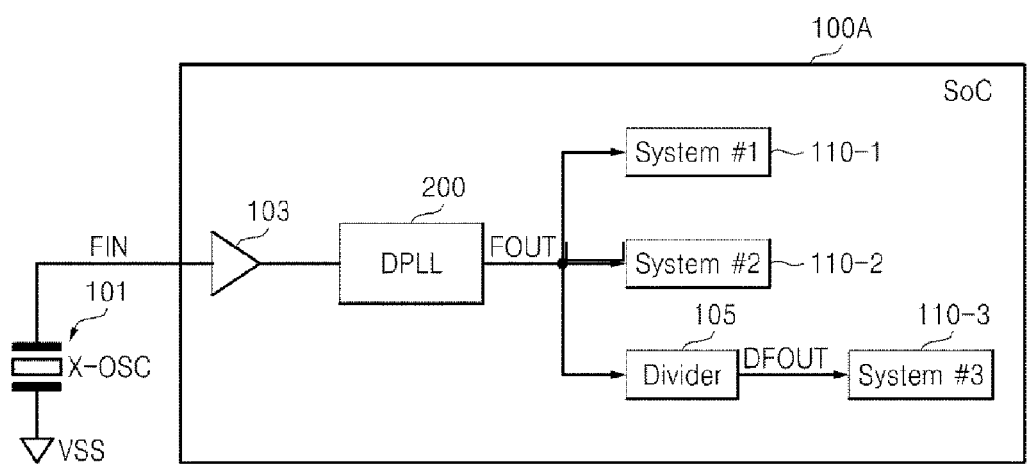
FIG. 1 is a block diagram of a system-on-chip (SoC) including a digital phase-locked loop (DPLL), according to an exemplary embodiment.

Exemplary embodiments now will be described more fully hereinafter with reference to the accompanying drawings. The inventive concept may, however, be embodied in many different forms and should not be construed as limited to the exemplary embodiments set forth herein. Rather, these exemplary embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular exemplary embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a system-on-chip (SoC) according to an exemplary embodiment. An SoC 100A includes a buffer 103, a digital phase-locked loop (DPLL) 200, a plurality of systems 110-1 through 110-3, and a divider 105.

The buffer 103 buffers an output signal of a crystal oscillator (X-OSC) 101 implemented outside the SoC 100A and generates an input clock signal FIN.

The DPLL 200 is a digital phase-locked loop (PLL) circuit having a new structure using a phase-to-digital converter (PDC). The DPLL 200 may quantize a phase difference between a feedback signal of the DPLL 200 and a reference signal using a signal resulting from subdividing the phase of an output clock signal FOUT, generate a digital control code based on a quantized phase difference, and generate the output clock signal FOUT with a variable phase and frequency by controlling a digitally controlled oscillator using the digital control code. Here, the reference signal may be the input clock signal FIN, but the inventive concept is not restricted to the current exemplary embodiments. The reference signal may be a signal generated from the input clock signal FIN.

The systems 110-1 and 110-2 operate in response to the output clock signal FOUT. The divider 105 divides the output clock signal FOUT by a division factor and outputs a divided output clock signal DFOUT to the system 110-3.

The systems 110-1 through 110-3 are hardware or circuits that operate using the output clock signal FOUT or a clock signal related with the output clock signal FOUT. For instance, the system 110-1 may be a central processing unit (CPU), a processor, or an application processor (AP); the system 110-2 may be a graphics processing unit (GPU); and the system 110-3 may be a memory device or a memory controller. The systems are not particularly limited other than that the systems use the output clock signal or a signal derived from the output clock signal.

The systems 110-1 through 110-3 each may be an intellectual property (IP). Here, an IP is a function block used in the SoC 100A and may be a CPU, an application processor (AP), a processor, a core in a multi-core processor, a memory device, a universal serial bus (USB), a peripheral component interconnect (PCI), a digital signal processor (DSP), a mobile AP, a wired interface, a wireless interface, a controller, embedded software, a codec, a video module (such as a camera interface, a Joint Photographic Experts Group (JPEG) processor, a video processor, or a mixer), a three-dimensional (3D) graphics core, an audio system, or a driver.

The SoC 100A may be a part of an AP or a part of a mobile AP.

Figure 2:
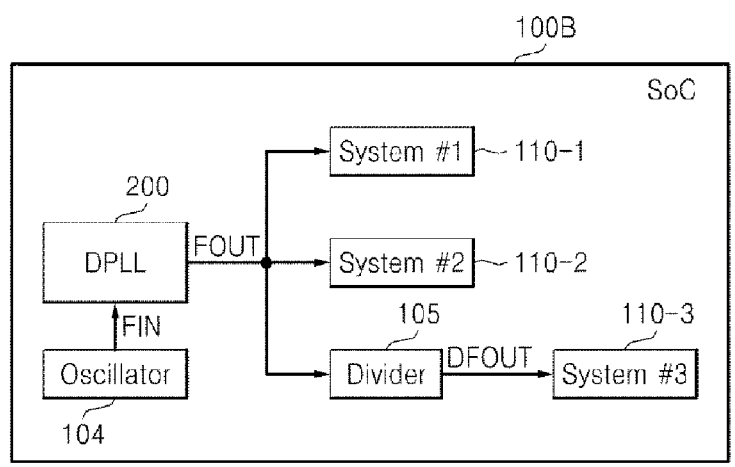
FIG. 2 is a block diagram of a SoC including the DPLL, according to another exemplary embodiment.

FIG. 2 is a block diagram of an SoC according to another exemplary embodiment. An SoC 100B includes the DPLL 200. The structure and the functions of the SoC 100B illustrated in FIG. 2 are substantially the same as those of the SoC 100A illustrated in FIG. 1, with the exception that an oscillator 104 that generates the input clock signal FIN of the DPLL 200 is implemented within the SoC 100B.

Figure 3:
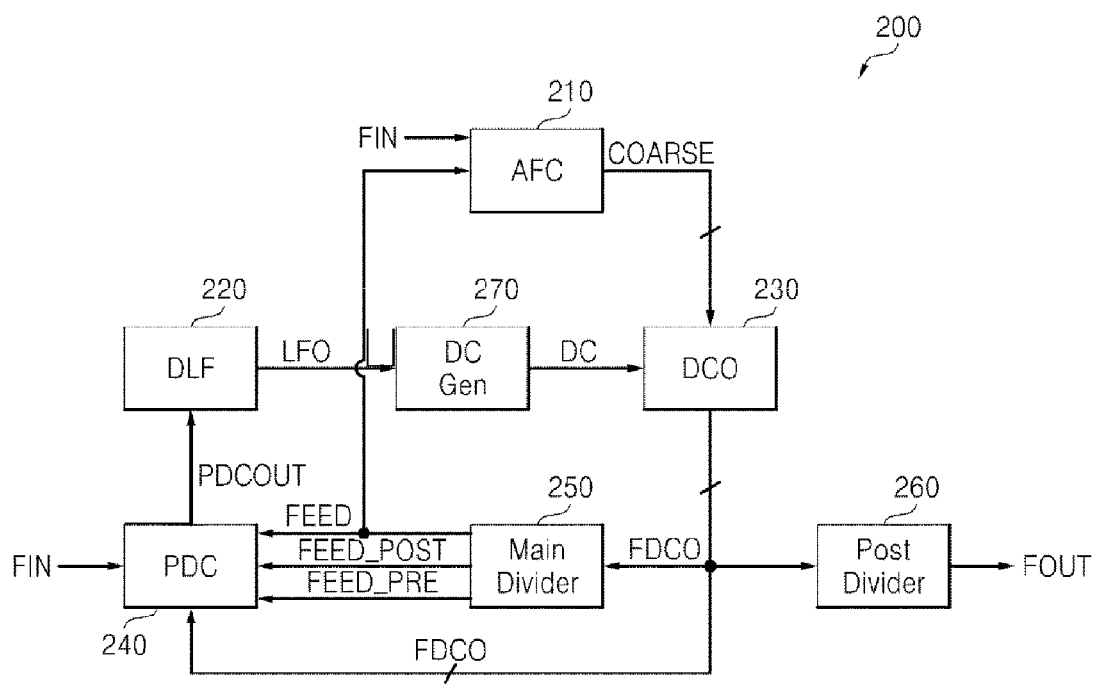
FIG. 3 is a block diagram of the DPLL of FIG. 1 or FIG. 2, according to an exemplary embodiment.

FIG. 3 is a block diagram of the DPLL 200 according to an exemplary embodiment. Referring to FIG. 3, the DPLL 200 includes a digitally-controlled oscillator (DCO) 230, a main divider 250, a phase-to-digital converter (PDC) 240, a digital loop filter (DLP) 220, and a digital code generator (DC Gen) 270. The DPLL 200 may also include an automatic frequency controller (AFC) 210 and a post divider 260.

The DCO 230 changes the frequency and the phase of an output oscillation signal FDCO in response to a digital control code DC.

The main divider 250 divides the output oscillation signal FDCO by a division factor to generate a first feedback signal FEED. The division factor of the main divider 250 may be an integer or a real number.

The main divider 250 also generates a second feedback signal (FEED_PRE) and a third feedback signal (FEED_POST) that have the same frequency as the first feedback signal FEED but have a different phase than the first feedback signal FEED. The second feedback signal FEED_PRE may lead the first feedback signal FEED by a first phase difference and the third feedback signal FEED_POST may lag behind the first feedback signal FEED by a second phase difference.

The first phase difference and the second phase difference may be a "p" clock cycle and a "q" clock cycle, respectively, of the output oscillation signal FDCO, where "p" and "q" are 1 or an integer greater than 1. However, the inventive concept is not restricted to the current exemplary embodiments. For instance, the second feedback signal FEED_PRE may lead the first feedback signal FEED by "p" clock cycles of the output oscillation signal FDCO and the third feedback signal FEED_POST may lag behind the first feedback signal FEED by "q" clock cycles of the output oscillation signal FDCO. The second feedback signal FEED_PRE and the third feedback signal FEED_POST may form timing for a deadzone-free phase-frequency detector (PFD). This will be described later with reference to FIG. 5.

The PDC 240 quantizes a phase difference between the reference signal FIN and the first feedback signal FEED to output a quantized code PDCOUT having a resolution. The resolution may be predetermined. In detail, the PDC 240 subdivides the phase of the output oscillation signal FDCO output from the DCO 230 and quantizes the phase difference between the reference signal FIN and the first feedback signal FEED using a phase-subdivided signal resulting from the subdivision. Accordingly, the resolution of the quantized code PDCOUT depends on how many segments the phase of the output oscillation signal FDCO is subdivided into. The output oscillation signal FDCO output from the DCO 230 may be a multi-phase signal (e.g., an n-phase signal where "n" is 2 or an integer greater than 2).

The DLF 220 filters the quantized code PDCOUT to generate a filter output signal LFO. The DC generator (DC Gen) 270 generates the digital control code DC for finely controlling the DCO 230 using the filter output signal LFO. The AFC 210 generates a coarse control code COARSE and the DC generator (DC Gen) 270 generates a fine control code, i.e., the digital control code DC.

When the AFC 210 is included, the DPLL 200 may operate in a coarse frequency tuning mode in which the frequency of the output oscillation signal FDCO is roughly tuned by tuning the coarse control code COARSE and in a fine frequency tuning mode in which the frequency and the phase of the output oscillation signal FDCO is finely tuned by tuning the digital control code DC. In the coarse frequency tuning mode, the AFC 210 compares the reference signal FIN with the first feedback signal FEED and generates the coarse control code COARSE so that the frequency of the first feedback signal FEED approximates the frequency of the reference signal FIN. However, as described above, the AFC 210 may be omitted, in which case only fine tuning is performed.

The post divider 260 may divide the output oscillation signal FDCO of the DCO 230 by a division factor and generate an output clock signal FOUT. However, as described above, the post divider 260 is optional and may be omitted, in which case the output oscillation signal FDCO may be output.

Figure 4:
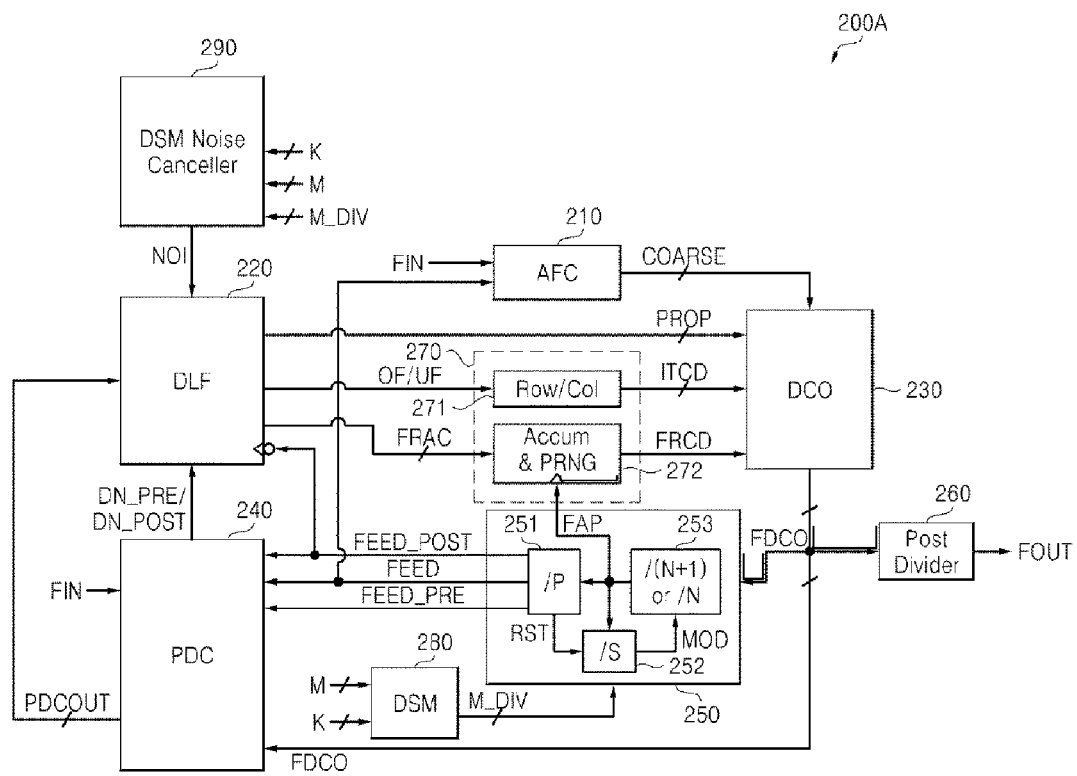
FIG. 4 is a block diagram of a DPLL according to another exemplary embodiment.

FIG. 4 is a block diagram of a DPLL according to another exemplary embodiment. A DPLL 200A includes the same structures and functions as the DPLL 200 of FIG. 3. However, referring to FIG. 4, the DPLL 200A may further include a delta-sigma modulation (DSM) module 280 and a DSM noise canceller 290 as compared to the DPLL 200 illustrated in FIG. 3.

Figure 5:
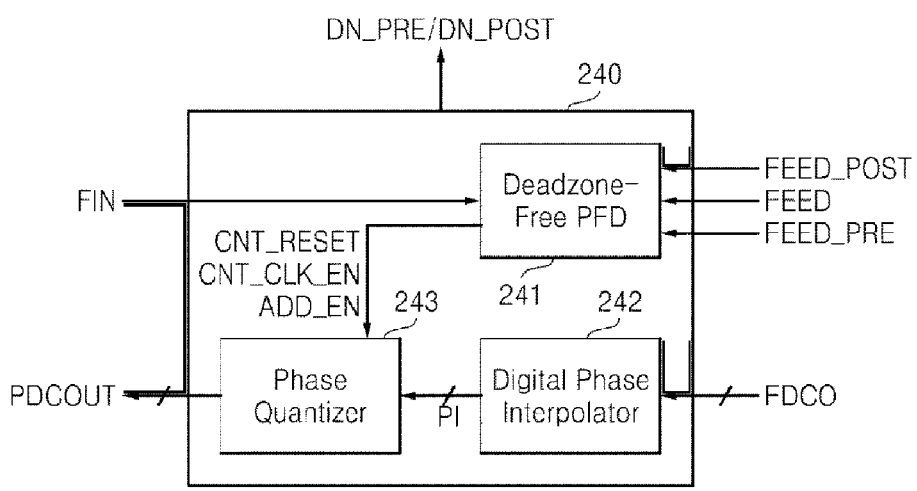
FIG. 5 is a structural block diagram of a phase-to-digital converter (PDC) of the DPLL illustrated in FIGS. 3 and 4 according to an exemplary embodiment.

FIG. 5 is a structural block diagram of the PDC 240 of the DPLL 200 or the DPLL 200A illustrated in FIGS. 3 and 4, respectively, according to an exemplary embodiment. Referring to FIG. 5, the PDC 240 includes a deadzone-free phase-frequency detector (PFD) 241, a phase interpolator 242, and a phase quantizer 243. The phase interpolator 242 subdivides the phase of the output oscillation signal FDCO. The deadzone-free PFD 241 and the phase quantizer 243 are described in detail later.

Figure 6:
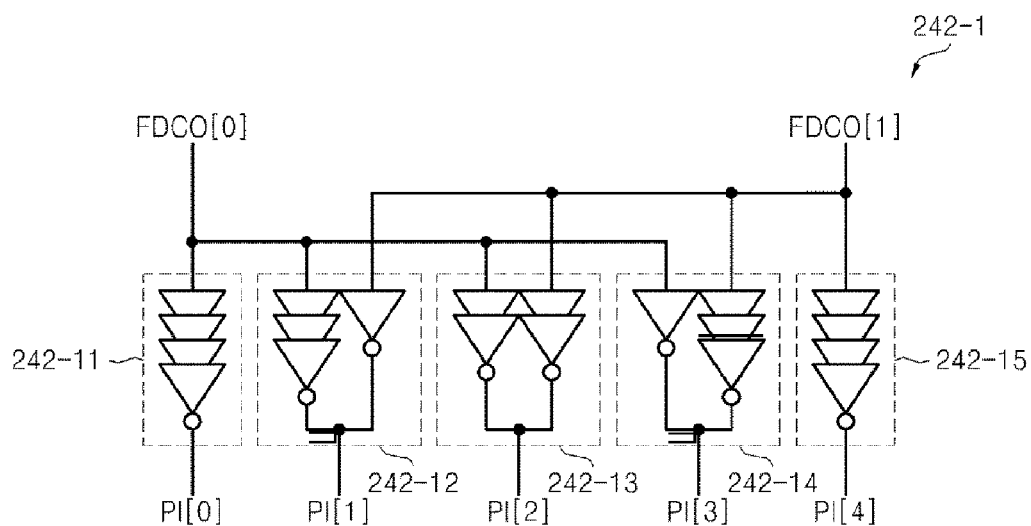
FIG. 6 is a circuit diagram of a part of a phase interpolator according to an exemplary embodiment.
Figure 7:
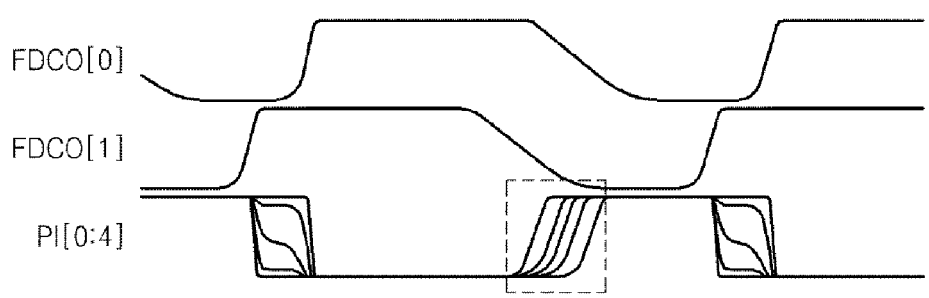
FIG. 7 is a waveform diagram illustrating the operations of the phase interpolator of FIG. 6.

FIG. 6 is a circuit diagram of a part of the phase interpolator 242 of FIG. 5, according to an exemplary embodiment. Hereinafter, the part of the phase interpolator 242 will be referred to as a first phase interpolator 242-1 of the phase interpolator 242. FIG. 7 is a waveform diagram illustrating operations of the first phase interpolator 242-1 illustrated in FIG. 6.

The first phase interpolator 242-1 illustrated in FIG. 6 interpolates two input phase signals, i.e., a first input phase signal FDCO[0] and a second input phase signal FDCO[1] having different phases, respectively, and outputs five different output phase signals, i.e., first output phase signal PI[0] through fifth output phase signal PI[4]. For this operation, the first phase interpolator 242-1 includes first phase generation circuit 242-11 through fifth phase generation circuit 242-15. Each of the first phase generation circuit 242-11 through the fifth phase generation circuit 242-15 includes four inverters. The first phase generation circuit 242-11 through the fifth phase generation circuit 242-15 connected in parallel with one another.

The four inverters of the first phase generation circuit 242-11 are arranged in series. The first input phase signal FDCO[0] is input to the four inverters of the first phase generation circuit 242-11 and the first output phase signal PI[0] is output from the four inverters of the first phase generation circuit 242-11. The four inverters of the second phase generation circuit 242-12 are arranged such that three inverters are arranged in series. The first input phase signal FDCO[0] is input to the three inverters of the second phase generation circuit 242-12 and the second input phase signal FDCO[1] is input to the remaining inverter of the second phase generation circuit 242-12. The four inverters of the third phase generation circuit 242-13 are arranged such that two inverters are arranged in series, and two remaining inverters are arranged in series. The first input phase signal FDCO[0] is input to two of the four inverters of the third phase generation circuit 242-13 and the second input phase signal FDCO[1] is input to the two remaining inverters of the third phase generation circuit 242-13. The four inverters of the fourth phase generation circuit 242-12 are arranged such that three inverters are arranged in series. The second input phase signal FDCO[1] is input to the three inverters of the fourth phase generation circuit 242-14 and the first input phase signal FDCO[0] is input to the remaining inverter of the fourth phase generation circuit 242-14. The four inverters of the fifth phase generation circuit 242-15 are arranged in series. The second input phase signal FDCO[1] is input to the four inverters of the fifth phase generation circuit 242-15 and the fifth output phase signal PI[4] is output from the four inverters of the fifth phase generation circuit 242-15.

In this manner, the ratios of the first input phase signal FDCO[0] to the second input phase signal FDCO[1] are set to be different, for example, 4:0, 3:1, 2:2, 1:3, and 0:4, for the first phase generation circuit 242-11 through the fifth phase generation circuit 242-15, respectively, so that the output phase signals PI[0] through PI[4] respectively having five different phases are obtained as shown in FIG. 7.

Returning to FIGS. 3 and 4, the output oscillation signal FDCO output from the DCO 230 may be a multi-phase signal as mentioned above. For instance, when it is assumed that the DCO 230 outputs the output oscillation signal FDCO having eight different phases FDCO[0] through FDCO[7], the first input phase signal FDCO[0] and the second input phase signal FDCO[1] may be signals respectively having neighboring phases in the multi-phase output oscillation signal FDCO output from the DCO 230. In this case, the phase interpolator 242 of FIG. 5 may include second through eighth phase interpolators (not shown) that respectively interpolate the signals FDCO[1] and FDCO[2], the signals FDCO[2] and FDCO[3], the signals FDCO[3] and FDCO[4], the signals FDCO[4] and FDCO[5], the signals FDCO[5] and FDCO[6], the signals FDCO[6] and FDCO[7], and the signals FDCO[7] and FDCO[0] in addition to the first phase interpolator 242-1 interpolating the signals FDCO[0] and FDCO[1], thereby generating a 32-phase output signal from the 8-phase signal FDCO (i.e., the signals FDCO[1] through FDCO[7]) output from the DCO 230. The structure and the function of the second through eighth phase interpolators are substantially the same as those of the first phase interpolator 242-1. The number of phases is not particularly limited.

However, the phase interpolator 242 is just an example of subdividing the phase of the output oscillation signal FDCO, and different methods may be used to subdivide the phase of the output oscillation signal FDCO. For instance, instead of the phase interpolator 242, a multiphase generator (not shown) that generates a plurality of phase signals having a different phase from each other from the output oscillation signal FDCO may be used. Accordingly, the phase interpolator 242 may be replaced with a circuit that can produce more phases than the phase of the output oscillation signal FDCO. Unlike the phase interpolator 242 that generates a multiphase signal by interpolating the first input phase signal FDCO[0] and the second input phase signal FDCO[1], the multiphase generator may generate an output phase signal having mores phases than an input phase signal by performing extrapolating on the input phase signal. For instance, the multiphase generator may generate phase signals, which lag behind the second input phase signal FDCO[1], from the first input phase signal FDCO[0]. As for the structure and the operation of a multiphase generator using extrapolating, a multiphase generator disclosed in Korean Patent Application No. 10-2013-0027767 filed in Korea on Mar. 15, 2013 may be used. The disclosure of Korean Patent Application No. 10-2013-0027767 filed in Korea on Mar. 15, 2013 is hereby incorporated by reference in its entirety.

Figure 8:
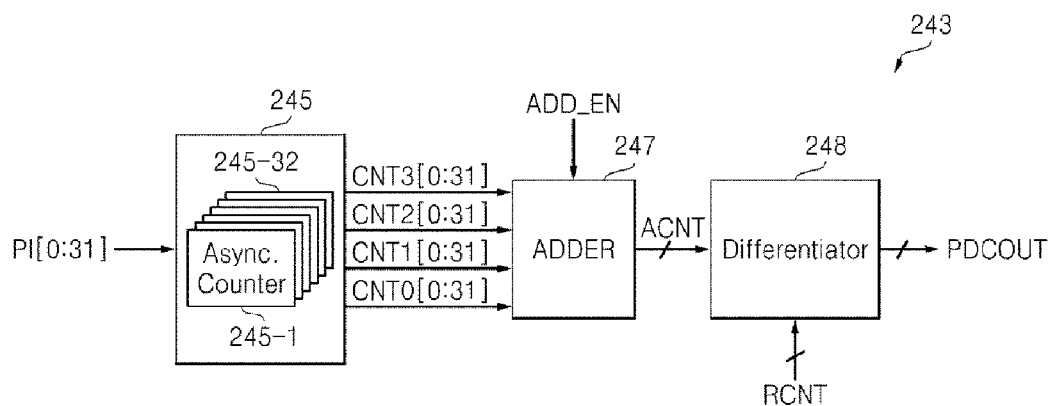
FIG. 8 is a structural block diagram of a phase quantizer of the PDC illustrated in FIG. 5 according to an exemplary embodiment.

FIG. 8 is a structural block diagram of the phase quantizer 243 illustrated in FIG. 5 according to an exemplary embodiment. The phase quantizer 243 includes a counter block 245, an adder 247, and a differentiator 248.

The counter block 245 may include a plurality of asynchronous counters 245-1 through 245-32. The asynchronous counters 245-1 through 245-32 are respectively provided for the phase-interpolated signals, e.g., 32 phase signals PI[0:31], output from the phase interpolator 242 and respectively receive the 32 phase signals PI[0:31]. Each of the asynchronous counters 245-1 through 245-32 may be a 4-bit counter that counts edges (e.g., rising edges or falling edges) of a corresponding one of the 32 phase signals and outputs a count value of four bits CNT1 through CNT3, but the inventive concept is not restricted to the current exemplary embodiments. That is, the number of phase signals, and the number of counter bits are not particularly limited.

The asynchronous counters 245-1 through 245-32 substantially have the same structure and operation. Therefore, the structure and the operation of only the first asynchronous counter 245-1 will be described for sake of convenience and clarity in the description.

Figure 9:
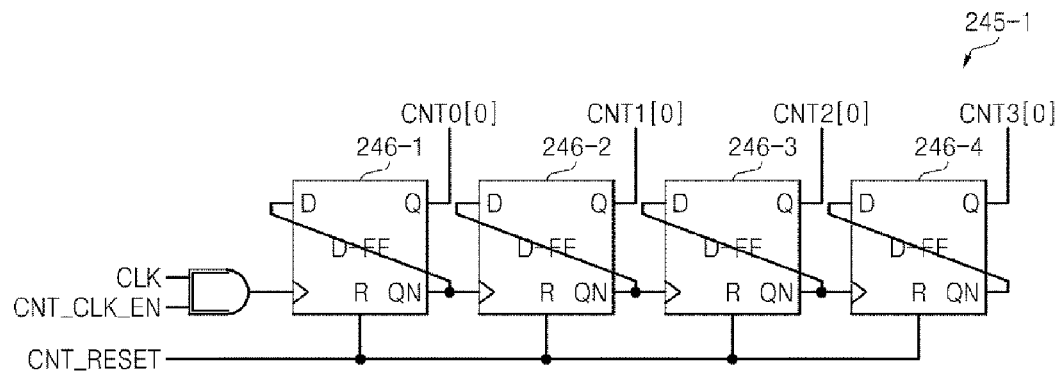
FIG. 9 is a circuit diagram of a first asynchronous counter of the phase quantizer illustrated in FIG. 8 according to an exemplary embodiment.

FIG. 9 is a circuit diagram of the first asynchronous counter 245-1 illustrated in FIG. 8 according to an exemplary embodiment. The first asynchronous counter 245-1 may include first D flip-flop (D-FF) 246-1 through fourth D flip-flop (D-FF) 246-4. The first D-FF 246-1 through the fourth D-FF 246-4 are reset in response to a counter reset signal CNT_RESET.

A signal resulting from an AND operation of a counter clock signal CLK and a counter enable signal CNT_CLK_EN is input to a clock terminal of the first D-FF 246-1. The counter clock signal CLK is one of the phase signals PI[0] through PI[31] output from the phase interpolator 242. For example, the counter clock signal CLK may be PI[0]. The counter reset signal CNT_RESET and the counter enable signal CNT_CLK_EN are quantizer control signals output from the deadzone-free PFD 241. The first asynchronous counter 245-1 counts the edges (e.g., rising edges or falling edges) of the counter clock signal CLK, i.e., the corresponding phase signal PI[0], while the counter enable signal CNT_CLK_EN is enabled and outputs a count value of four bits CNT0[0] through CNT3[0]. It may be understood that additional counter bits may be added by increasing the number of D-FFs.

Referring back to FIG. 8, the adder 247 adds the 4-bit count values CNT0[0:31] through CNT3[0:31] output from the asynchronous counters 245-1 through 245-32 in response to an adder enable signal ADD_EN and outputs an added count value ACNT.

The differentiator 248 calculates a difference between the added count value ACNT and a reference count value RCNT and outputs the difference as the quantized code PDCOUT. The reference count value RCNT may be a value corresponding to the phase difference between the second feedback signal FEED_PRE and the first feedback signal FEED. For instance, the reference count value RCNT may be a value obtained by counting edges (e.g., rising edges or falling edges) of the phase signal PI[0:31] between the second feedback signal FEED_PRE and the first feedback signal FEED.

Figure 11A:
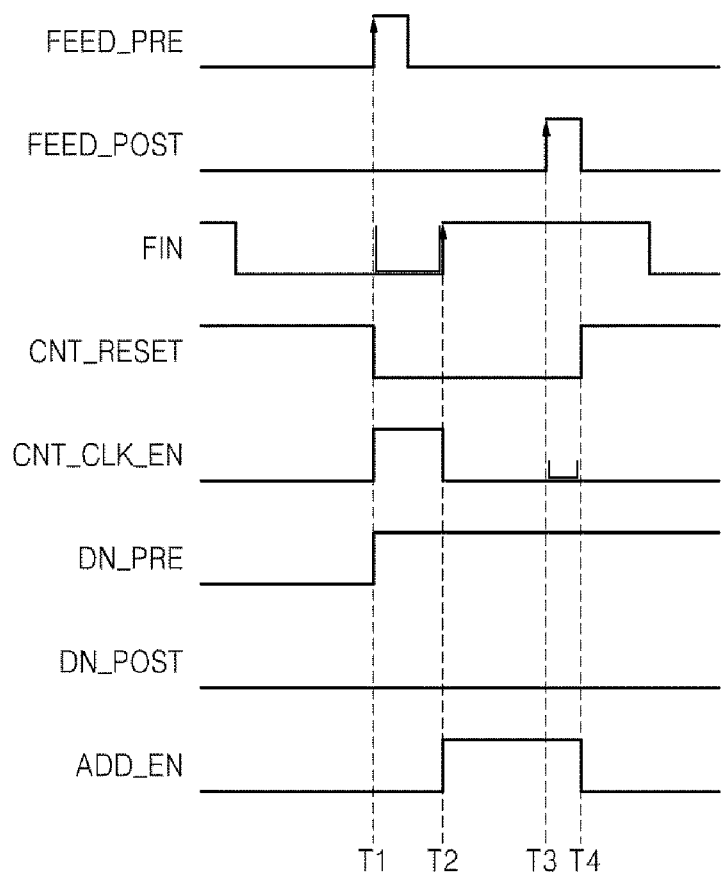
FIG. 11A is a timing chart of input and output signals of the DFPFD of FIG. 10.
Figure 11B:
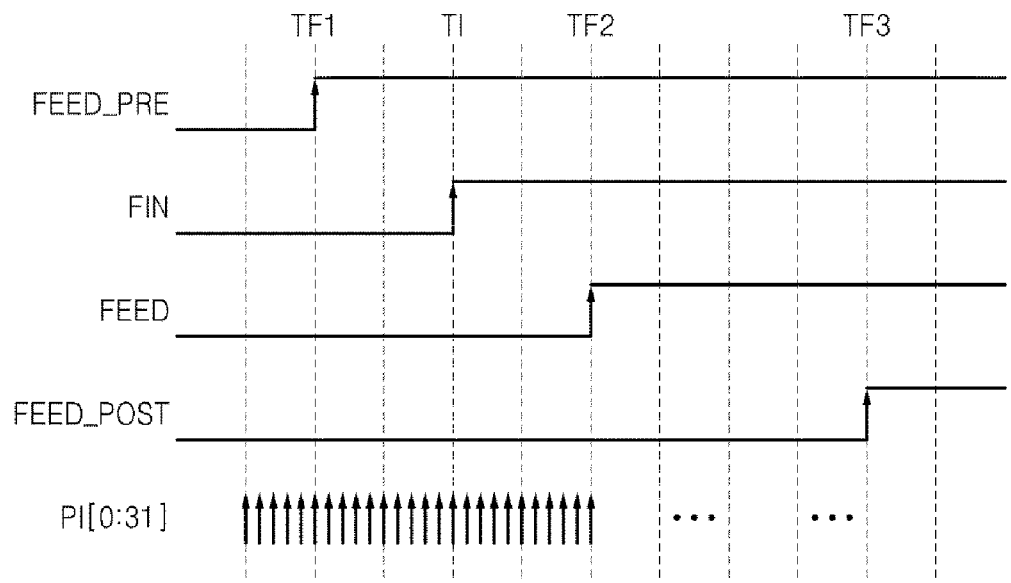
FIG. 11B is a timing chart illustrating the operations of the phase quantizer illustrated in FIG. 8.

FIG. 11B is a timing chart illustrating the operations of the phase quantizer 243 illustrated in FIG. 5. Referring to FIG. 11B, the reference count value RCNT may be a value obtained by counting all rising edges of the phase signal PI[0:31] from a time point TF1 to a time point TF2.

When the second feedback signal FEED_PRE leads the first feedback signal FEED by the "p" clock cycles of the output oscillation signal FDCO, the reference count value RCNT is the product of "p" and 32, i.e., p×32. For instance, when "p" is 4, the reference count value RCNT is 128.

The added count value ACNT may be a value corresponding to the phase difference between the second feedback signal FEED_PRE and the reference signal FIN. For instance, the added count value ACNT may be a value obtained by counting edges (e.g., rising edges or falling edges) of the phase signal PI[0:31] between the second feedback signal FEED_PRE and the reference signal FIN. Referring to FIG. 11B, the added count value ACNT may be a value obtained by counting all rising edges of the phase signal PI[0:31] from the time point TF1 to a time point T1.

Accordingly, the quantized code PDCOUT corresponding to the difference between the added count value ACNT and the reference count value RCNT is a value corresponding to the phase difference between the first feedback signal FEED and the reference signal FIN. Referring to FIG. 11B, the quantized code PDCOUT may be a value obtained by counting all rising edges of the phase signal PI[0:31] from the time point T1 to the time point TF2.

Referring back to FIG. 5, the deadzone-free PFD 241 outputs control signals for controlling the operation of the phase quantizer 243 and the DLF 220. The deadzone-free PFD 241 generates the control signals CNT_RESET, CNT_CLK_EN, and ADD_EN for controlling the phase quantizer 243 using the first feedback signal FEED, the second feedback signal FEED_PRE, and the third feedback signal FEED_POST and generates control signals DN_PRE and DN_POST for controlling the operation of the DLF 220.

Figure 10:
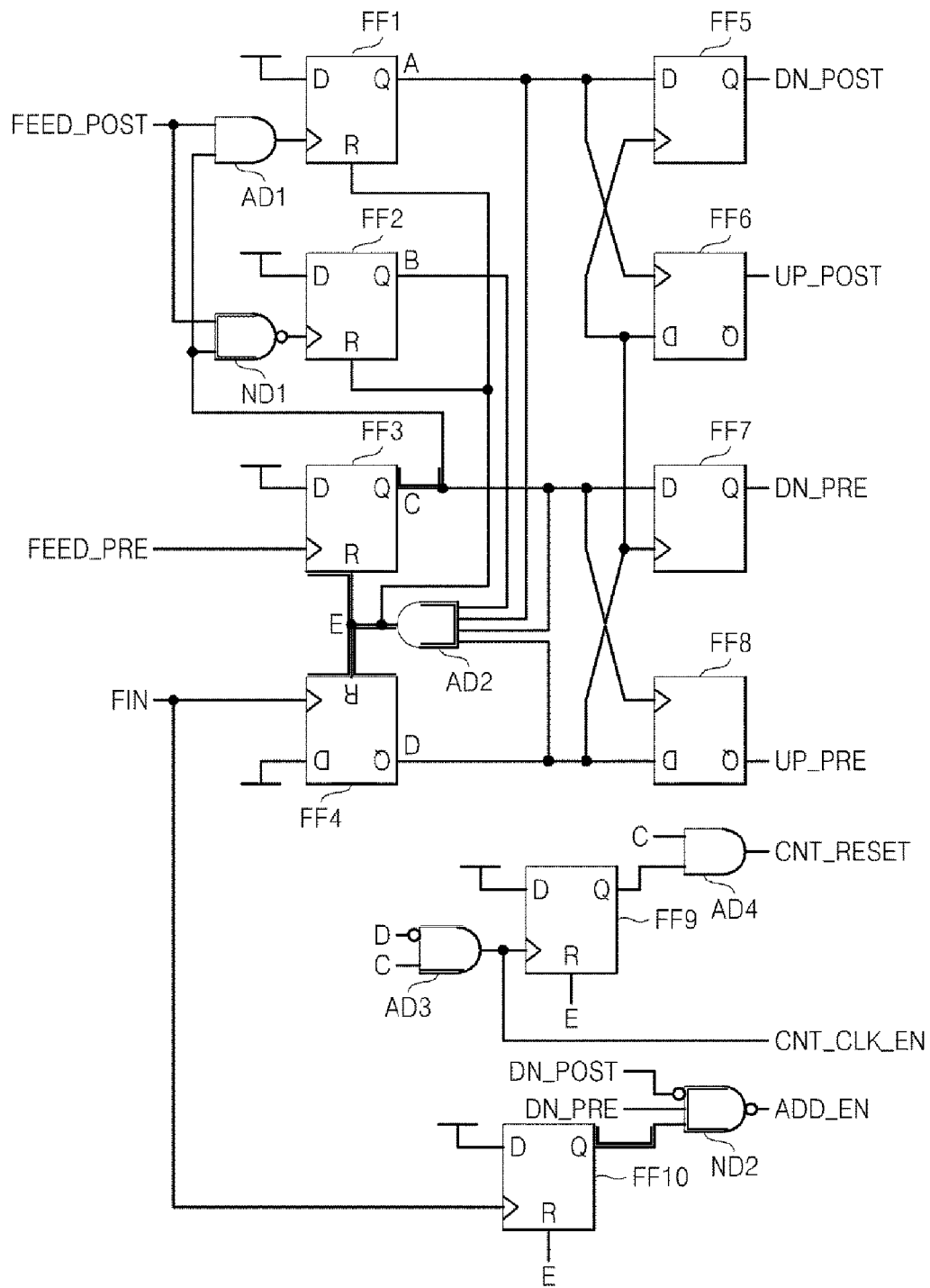
FIG. 10 is a circuit diagram of a deadzone-free phase-frequency detector (DFPFD) according to an exemplary embodiment.

FIG. 10 is a circuit diagram of the deadzone-free PFD 241 according to an exemplary embodiment. FIG. 11A is a timing chart of input and output signals of the deadzone-free PFD 241. Referring to FIG. 10, the deadzone-free PFD 241 includes first D-FF FF1 through tenth D-FF FF10, a plurality of AND elements AD1 through AD4, and a plurality of NAND elements ND1 and ND2.

A signal obtained by performing an AND operation on the third feedback signal FEED_POST and a Q output signal C of the third D-FF FF3 is input to a clock terminal of the first D-FF FF1. A signal obtained by performing a NAND operation on the third feedback signal FEED_POST and the Q output signal C of the third D-FF FF3 is input to a clock terminal of the second D-FF FF2. The second feedback signal FEED_PRE is input to a clock terminal of the third D-FF FF3. The reference signal FIN is input to a clock terminal of each of the fourth D-FF FF4 and the tenth D-FF FF10. A D input terminal of each of the first D-FF FF1 through the fourth D-FF FF4 and the ninth D-FF FF9 and the tenth D-FF FF10 is connected to a power supply voltage. The power supply voltage may be predetermined. An E signal is input to a reset terminal R of each of the first D-FF FF1 through the fourth D-FF FF4, the ninth D-FF FF9 and the tenth D-FF FF10. The E signal is a result of performing an AND operation on Q output signals A, B, C, and D of the respective first D-FF FF1 through the fourth D-FF FF4. A D input terminal of the fifth D-FF FF5 is connected to a clock terminal of the sixth D-FF FF6. A D input terminal of the sixth D-FF FF6 is connected to clock terminals of the respective fifth D-FF FF5 and seventh D-FF FF7. A D input terminal of the seventh D-FF FF7 is connected to a clock terminal of the eighth D-FF FF8. A D input terminal of the eighth D-FF FF8 is connected to the clock terminal of the seventh D-FF FF7. A signal obtained by performing an AND operation on the signal C and an inverted signal of the signal D is input to a clock terminal of the ninth D-FF FF9.

The fifth D-FF FF5 through the eighth D-FF FF8 respectively output the down post signal DN_POST, an up post signal UP_POST, the down pre signal DN_PRE, and an up pre signal UP_PRE as Q outputs. The AND element AD4 performs an AND operation on the signal C and a Q output signal of the ninth D-FF FF9 and outputs the counter reset signal CNT_RESET as a result.

The NAND element ND2 performs a NAND operation on an inverted signal of the down post signal DN_POST, the down pre signal DN_PRE, and a Q output signal of the tenth D-FF FF10 and outputs the adder enable signal ADD_EN as a result.

The timing of the input and output signals of the deadzone-free PFD 241 will be described with reference to FIG. 11A. The counter reset signal CNT_RESET is disabled to a low level in response to a rising edge of the second feedback signal FEED_PRE and the counter enable signal CNT_CLK_EN is enabled to a high level, so that each of the counters 245-1 through 245-32 starts to count edges (e.g., rising edges) of a phase signal.

The counter enable signal CNT_CLK_EN is disabled to a low level in response to a rising edge of the reference signal FIN, so that the counters 245-1 through 245-32 stop counting. In response to the rising edge of the reference signal FIN, the adder enable signal ADD_EN is enabled to a high level. In response to the adder enable signal ADD_EN, the adder 247 adds up the count values CNT0[0:31], CNT1[0:31], CNT2[0:31], and CNT4[0:31] of the counters 245-1 through 245-32, thereby outputting the added count value ACNT.

Consequently, the counters 245-1 through 245-32 may count the rising edges of a phase signal between the rising edge of the second feedback signal FEED_PRE and the rising edge of the reference signal FIN. The adder 247 adds up the count values of the counters 245-1 through 245-32. Accordingly, the added count value ACNT output from the adder 247 corresponds to the number of rising edges of the 32 phase signals between the rising edge of the second feedback signal FEED_PRE and the rising edge of the reference signal FIN.

In response to a falling edge of the third feedback signal FEED_POST, the counter reset signal CNT_RESET is enabled to a high level, so that the counters 245-1 through 245-32 are reset. Accordingly, the counting operation of the counters 245-1 through 245-32 may last up to the falling edge of the third feedback signal FEED_POST.

The second feedback signal FEED_PRE and the third feedback signal FEED_POST define the operation period of the counters 245-1 through 245-32. In detail, the counters 245-1 through 245-32 start the counting operation at the rising edge of the second feedback signal FEED_PRE and stop the counting operation at the rising edge of the reference signal FIN. When the rising edge does not occur in the reference signal FIN until the falling edge of the third feedback signal FEED_POST, the counters 245-1 through 245-32 continue the counting operation until the falling edge of the third feedback signal FEED_POST and are reset at the falling edge of the third feedback signal FEED_POST. Therefore, the period between the rising edge of the second feedback signal FEED_PRE and the falling edge of the third feedback signal FEED_POST may be referred to as a dynamic range of the phase quantizer 243.

As shown in FIG. 11A, when the rising edge of the reference signal FIN occurs between the second feedback signal FEED_PRE and the third feedback signal FEED_POST, the down pre signal DN_PRE and the down post signal DN_POST respectively have complementary levels (i.e., different levels) to each other. When the rising edge of the reference signal FIN does not occur between the second feedback signal FEED_PRE and the third feedback signal FEED_POST, the down pre signal DN_PRE and the down post signal DN_POST have the same level.

Each element of the PDC 240 is controlled to be enabled during only a certain period, so that power consumption is reduced.

Figure 12:
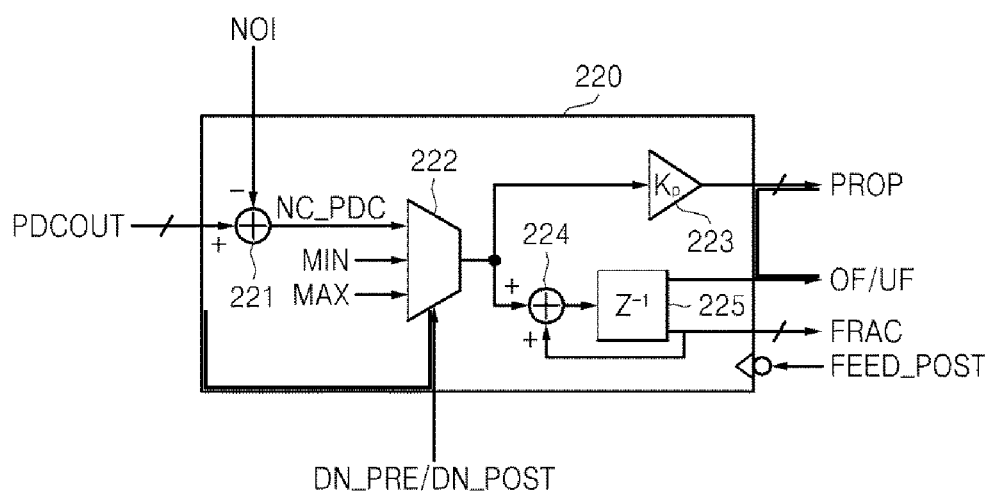
FIG. 12 is a structural block diagram of a digital loop filter (DLF) of the DPLL illustrated in FIGS. 3 and 4 according to an exemplary embodiment.

FIG. 12 is a structural block diagram of the DLF 220 of the DPLL illustrated in FIGS. 3 and 4 according to an exemplary embodiment. Referring to FIG. 12, the DLF 220 may include a subtractor 221, a multiplexer 222, a multiplier 223, a delay element 225, and an integrator 224. The DLF 22 receives as inputs a DSM noise value NOI and the quantized code PDCOUT, and the DLF 220 may output a value PROP obtained by multiplying an input code NC_PDC by a constant $K_p$ and a value FRAC (referred to as an integrated value) obtained by integrating the input code NC_PDC or a value obtained by adding a coefficient to or multiplying the coefficient by the integrated value.

The multiplexer 222 selects and outputs one of the input code NC_PDC, a first limit MIN, and a second limit MAX in response to the down pre signal DN_PRE and the down post signal DN_POST. When the rising edge of the reference signal FIN occurs between the second feedback signal FEED_PRE and the third feedback signal FEED_POST, the input code NC_PDC is selected. In other cases, the first limit MIN or the second limit MAX is selected. The first limit MIN and the second limit MAX may be −128 and 128, respectively, but are not restricted thereto. The input code NC_PDC is obtained by subtracting the DSM noise value NOI from the quantized code PDCOUT. The DSM noise value NOI will be described later.

The multiplier 223 multiplies an output signal of the multiplexer 222 by the constant $K_p$ to generate a first fine control code PROP. The integrator 224 integrates the output signal of the multiplexer 222 and a fractional code FRAC. The delay element 225 generates an overflow bit/underflow bit OF/UF and the fractional code FRAC according to the integration result. The delay element 225 may be implemented by a flip-flop.

The subtractor 221 subtracts the DSM noise value NOI from the quantized code PDCOUT to remove DSM noise from the quantized code PDCOUT and outputs the input code NC_PDC. The input code NC_PDC may correspond to a DSM noise-removed quantized code. The DSM noise value NOI is output from the DSM noise canceller 290. This will be described later.

Referring back to FIG. 4, the digital control code DC may correspond to a fine control code. Accordingly, the DC generator 270 generating the digital control code DC may be called a fine tuning circuit and allows the frequency of the feedback signal FEED to be tuned to a target frequency in the DPLL 200. The digital control code DC includes a first fine control code PROP, a second fine control code ITCD, and a third fine control code FRCD. The DC generator 270 includes a row/column decoder (Row/Col) 271 and an accumulator & pseudo random number generator (Accum & PRNG) 272.

The row/column decoder 271 may generate the second fine control code ITCD that increases in response to the overflow bit OF and that decreases in response to the underflow bit UF. The accumulator & pseudo random number generator 272 generates the third fine control code FRCD in response to the fractional code FRAC. In detail, the accumulator & pseudo random number generator 272 randomizes the fractional code FRAC in response to a clock signal FAP output from the main divider 250 and outputs a randomization result as the third fine control code FRCD. Based on the third fine control code FRCD, the resolution of the frequency of a DCO clock signal, i.e., the output oscillation signal FDCO output from the DCO 230, is improved and a spurious tone of the accumulator & pseudo random number generator 272 is removed.

The structure and the operation of an accumulator & pseudo random number generator that may be used as the accumulator & pseudo random number generator 272 is disclosed in Korean Patent Application No. 10-2012-0007129 filed in Korea on Jan. 25, 2012 and U.S. patent application Ser. No. 13/737,337 filed on Jan. 9, 2013, the disclosures of which are hereby incorporated by reference in their entirety.

Figure 13:
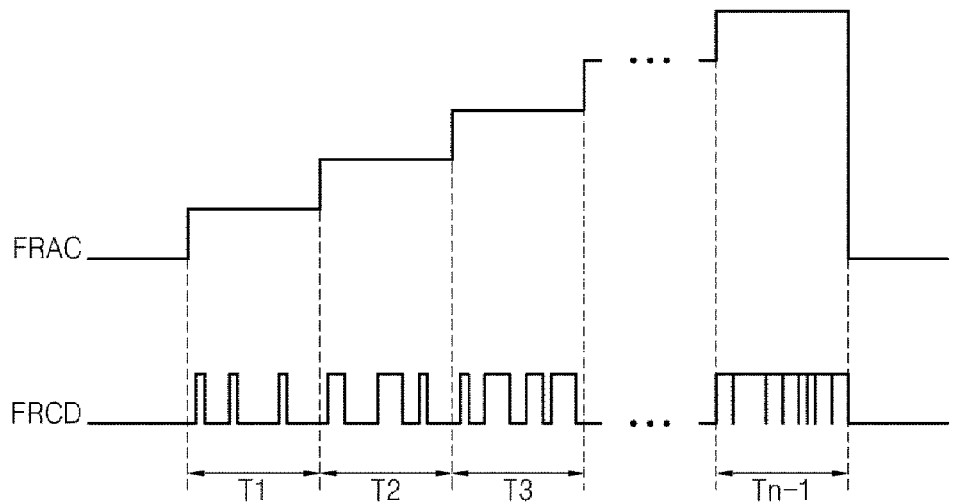
FIG. 13 is a conceptual diagram of the operation of an accumulator including a pseudo random number generator (PRNG) of the DPLL illustrated in FIG. 4.

FIG. 13 is a conceptual diagram of an example of the operation of the accumulator & pseudo random number generator 272 of the DPLL illustrated in FIG. 4. For clarity of the description, it is assumed that the third fine control code FRCD is 1 bit in length. Referring to FIG. 13, when the fractional code FRAC increases, the sum of pulse widths of a signal representing the third fine control code FRCD also increases.

For instance, when the fractional code FRAC is 5'/b00000, the signal representing the third fine control code FRCD is at a low level. When the fractional code FRAC is 5'/b00001 in a first section T1, the signal representing the third fine control code FRCD includes at least one pulse and the sum of the pulse width of the at least one pulse is $1/32$ of a cycle. Thus, for example, FIG. 13 shows three pulses in the first section T1, and the sum of the pulse widths of the three pulses is $1/32$ of a cycle. When the fractional code FRAC is 5'/b00010 in a second section T2, the signal representing the third fine control code FRCD includes at least one pulse and the sum of the pulse width of the at least one pulse is $2/32$ of the cycle. Thus, for example, FIG. 13 shows three pulses in the second section T2 and the sum of the pulse widths of the three pulses is $2/32$ of a cycle. When the fractional code FRAC is 5'/b00011 in a third section T3, the signal representing the third fine control code FRCD includes at least one pulse and the sum of the pulse width of the at least one pulse is $3/32$ of the cycle. Thus, for example, FIG. 13 shows four pulses in the third section T3, and the sum of the pulse widths of the four pulses is $3/32$ of a cycle. When the fractional code FRAC is 5'/b11111 in an (n−1)-th section Tn−1, the signal representing the third fine control code FRCD includes at least one pulse and the sum of the pulse width of the at least one pulse is $31/32$ of the cycle.

Here, the cycle may be a value, e.g., 32, related with the number of bits included in the fractional code FRAC.

Figure 14:
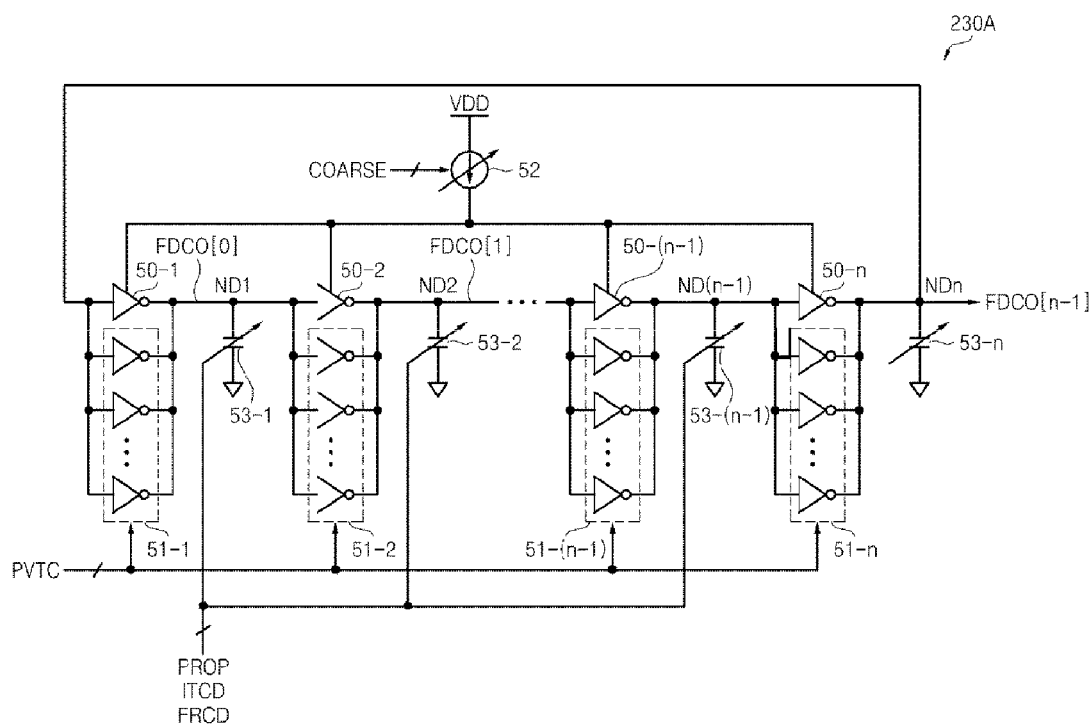
FIG. 14 is a circuit diagram of an example of a digitally-controlled oscillator (DCO) of the DPLL illustrated in FIGS. 3 and 4.

FIG. 14 is a circuit diagram of an example of the DCO 230 of the DPLLs illustrated in FIGS. 3 and 4. Referring to FIGS. 4 and 14, a DCO 230A includes a plurality of inverters 50-1 through 50-$n$ connected in a ring shape, a plurality of inverter blocks 51-1 through 51-$n$, a current source 52, and a plurality of capacitor bank arrays 53-1 through 53-$n$, where "n" is a natural number.

The inverter blocks 51-1 through 51-$n$ are respectively connected in parallel with the inverters 50-1 through 50-$n$. Thus, for example, inverter block 51-1 is connected in parallel with inverter 50-1, and inverter block 51-2 is connected in parallel with inverter 50-2, etc. The inverter blocks 51-1 through 51-$n$ each may be referred to as a delay cell. Each of the inverter blocks 51-1 through 51-$n$ is enabled or disabled in response to at least one corresponding bit among bits included in a control code PVTC. Each of the inverter blocks 51-1 through 51-$n$ includes a plurality of inverters connected in parallel with each other. When the number of inverters enabled increases, the driving performance increases. As a result, the frequency of the output oscillation signal FDCO of the DCO 230A increases.

The current source 52 may control the amount of current supplied to the inverters 50-1 through 50-$n$ in response to the coarse control code COARSE. The frequency of the output oscillation signal FDCO generated by the DCO 230A may be adjusted according to the amount of current. The amount of current is related with a power supply voltage VDD. In other words, when the amount of current supplied to the inverters 50-1 through 50-$n$ increases, the frequency of the output oscillation signal FDCO of the DCO 230A also increases.

The capacitor bank arrays 53-1 through 53-$n$ are respectively connected to nodes ND1 through NDn. The capacitance of the capacitor bank arrays 53-1 through 53-$n$ may be adjusted according to the first fine control code PROP, the second fine control code ITCD, and the third fine control code FRCD. Accordingly, the frequency of the output oscillation signal FDCO of the DCO 230A may be adjusted according to the capacitance.

The output oscillation signal FDCO of the DCO 230A may be an output signal of an inverter, for example, the last inverter 50-$n$, among the inverters 50-1 through 50-$n$. The output signals of the respective inverters 50-1 through 50-$n$ may constitute a multiphase output oscillation signal FDCO[0:$n-1$].

Figure 15:
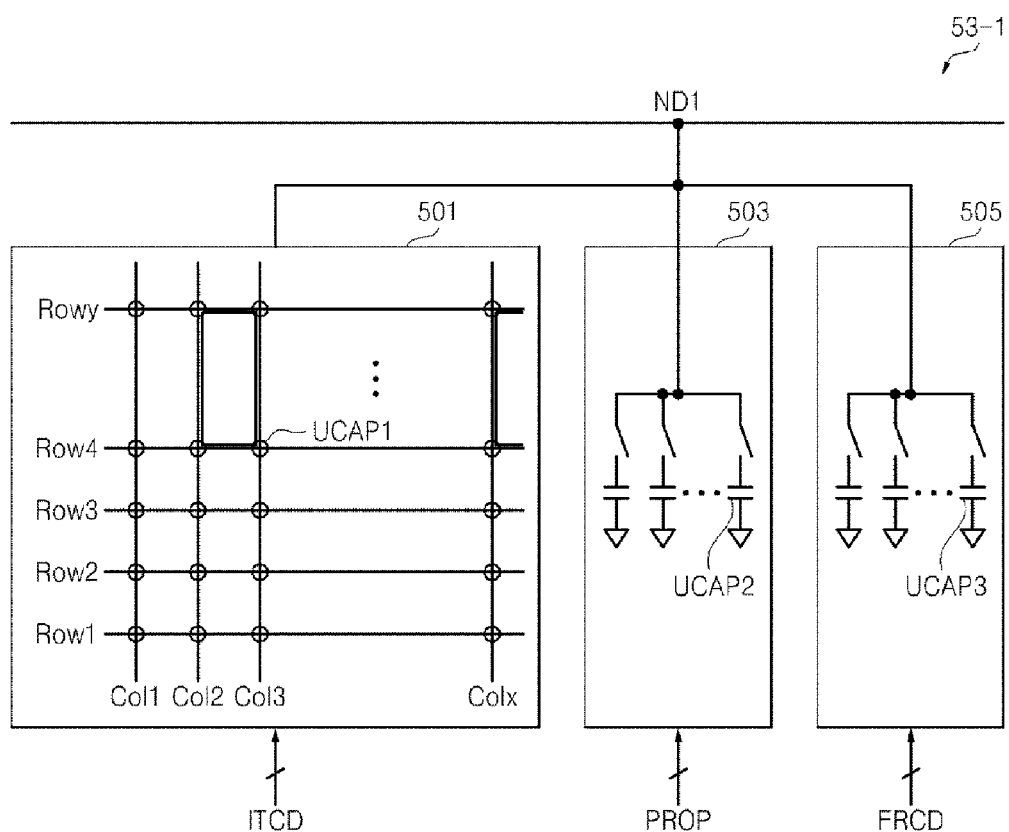
FIG. 15 is a conceptual diagram of the operation of a capacitor bank array of the DCO illustrated in FIG. 14.

FIG. 15 is a conceptual diagram of the operation of the capacitor bank arrays 53-1 through 53-$n$ of the DCO 230 illustrated in FIG. 14. Referring to FIGS. 4, 14, and 15, the structure and the operation of the capacitor bank arrays 53-1 through 53-$n$ are the same and, therefore, the structure and the operation of only the first capacitor bank array 53-1 will be described for the sake of convenience and clarity of the description. The first capacitor bank array 53-1 includes a first capacitor array 501, a second capacitor array 503, and a third capacitor array 505.

The first capacitor array 501 includes row lines ROW1 through ROWy, column lines COL1 through COLx, and a plurality of first unit capacitors UCAP1 arranged at the intersections of the row lines and column lines. An on or off state of the first unit capacitors UCAP1 is controlled according to each of bits in the second fine control code ITCD.

The row/column decoder 271 receives the overflow bit OF and the underflow bit UF and generates the second fine control code ITCD for turning on or off the first unit capacitors UCAP1 connected between the row lines ROW1 through ROWy and the column lines COL1 through COLx in the first capacitor array 501. Here, "on" indicates an operation in which the total capacitance of the first capacitor array 501 increases and "off" indicates an operation in which the total capacitance of the first capacitor array 501 decreases.

For instance, the row/column decoder 271 generates a second fine control code ITCD that increases the number of first unit capacitors UCAP1 turned on whenever the row/column decoder 271 receives the overflow signal OF. At this time, the total capacitance of the first capacitor array 501 increases. As a result, the frequency of the output oscillation signal FDCO of the DCO 230A decreases.

However, the row/column decoder 271 generates a second fine control code ITCD that increases the number of first unit capacitors UCAP1 turned off whenever the row/column decoder 271 receives the underflow bit UF. At this time, the total capacitance of the first capacitor array 501 decreases. As a result, the frequency of the output oscillation signal FDCO of the DCO 230A increases.

The number of capacitors turned on may be determined by default.

The second capacitor array 503 includes a plurality of second unit capacitors UCAP2. An on or off state of each of the second unit capacitors UCAP2 is controlled according to each of the bits in the first fine control code PROP, respectively. That is, the second unit capacitors and the bits in the first fine control code PROP are provided in a one-to-one relationship. The first fine control code PROP may be implemented by a thermometer code.

The third capacitor array 505 includes a plurality of third unit capacitors UCAP3. An on or off state of each of the third unit capacitors UCAP3 is controlled according to each of the bits in the third fine control code FRCD. That is, the third unit capacitors and the bits in the third fine control code FRCD are provided in a one-to-one relationship. The third fine control code FRCD may include one or more bits.

Figure 16:
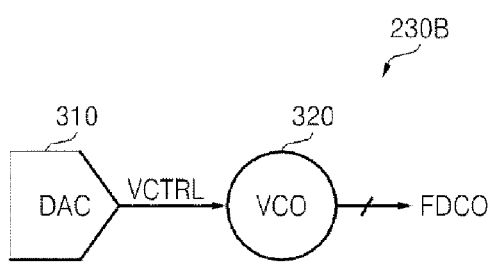
FIG. 16 is a circuit diagram of another example of a DCO of the DPLL illustrated in FIGS. 3 and 4.

FIG. 16 is a circuit diagram of another example of the DCO 230 illustrated in FIG. 4. Referring to FIGS. 4 and 16, a DCO 230B includes a digital-to-analog converter (DAC) 310 and a voltage-controlled oscillator (VCO) 320.

Figure 17:
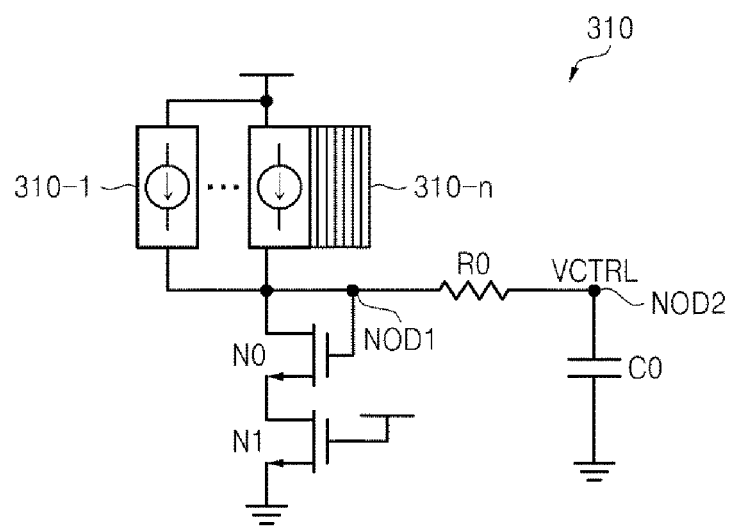
FIG. 17 is a circuit diagram of a digital-to-analog converter (DAC) of the DCO illustrated in FIG. 16.

FIG. 17 is a circuit diagram of the DAC 310 illustrated in FIG. 16. The DAC 310 changes the level of a control voltage VCTRL according to a control code. The control code includes the coarse control code COARSE and the first fine control code PROP, the second fine control code ITCD, and the third fine control code FRCD.

Referring to FIG. 17, the DAC 310 may include a plurality of current sources 301-1 to 301-$n$ connected in parallel to each other between a supply voltage and a first node NOD1, transistors N0 and N1 connected in series between the first node NOD1 and ground, a resistor R0 connected between the first node NOD1 and a second node NOD2, and a capacitor C0 connected between the second node NOD2 and ground. The control voltage VCTRL is a voltage of the second node NOD2.

Figure 18:
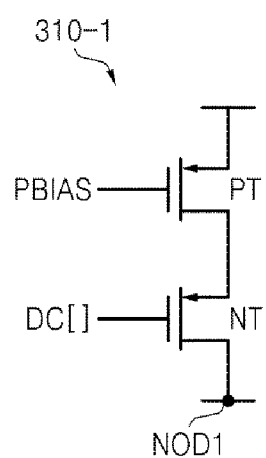
FIG. 18 is a circuit diagram of a current source of the DCO illustrated in FIG. 16.

FIG. 18 is a circuit diagram of a current source 310-1 illustrated in FIG. 17. Referring to FIG. 18, the current source 310-1 may include transistors PT and NT connected in series with each other between the supply voltage and the first node NOD1. The transistor PT may be controlled by a bias voltage PBIAS and the transistor NT may be controlled by a bit (i.e., a corresponding bit DC[ ]) in the control code.

The current source 310-1 may be turned on or off in response to the corresponding bit DC[ ] in the control code. In other words, an on or off state of each of the current sources 310-1 is controlled based on the corresponding bit DC[ ] in the control code. That is, the current sources 310-1 to 310-*n* may be provided in a one-to-one relationship with the bits DC[ ] in the control code.

When the current source 310-1 is turned on, the level of the control voltage VCTRL increases. When the current source 310-1 is turned off, the level of the control voltage VCTRL decreases. Accordingly, when the number of current sources 310-1 turned on increases, the level of the control voltage VCTRL also increases.

Figure 19:
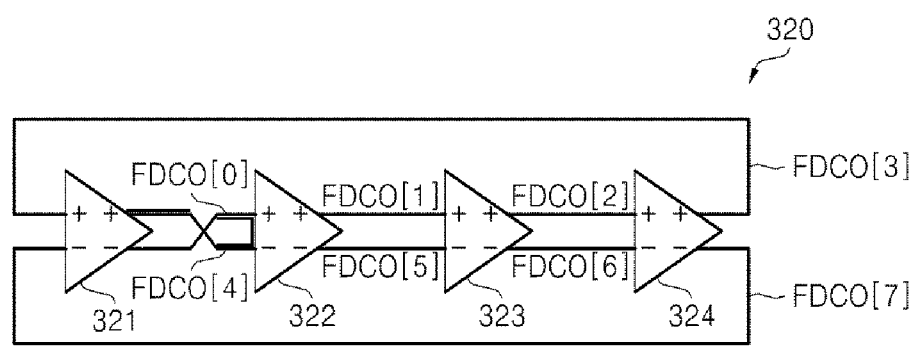
FIG. 19 is a circuit diagram of a voltage-controlled oscillator (VCO) of the DCO illustrated in FIG. 16.

FIG. 19 is a circuit diagram of the VCO 320 of the DCO 230 illustrated in FIG. 16. Referring to FIG. 19, the VCO 320 includes a plurality of buffers 321 through 324 connected to each other in a ring shape. Four buffers are shown in FIG. 19, but the number of buffers is not particularly limited and is not restricted to four. For example, the number of buffers may be 2 or a natural number greater than 2. Differential output signals of the buffers 321 through 324 may constitute a multiphase output oscillation signal FDCO[0:7]. A signal with one of phases of the multiphase output oscillation signal FDCO[0:7] may be applied to the main divider 250 and the post divider 260.

Figure 20:
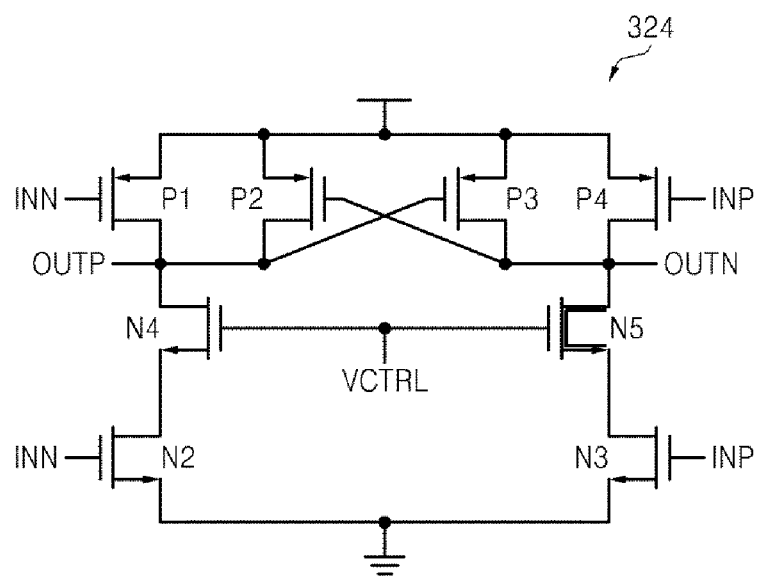
FIG. 20 is a circuit diagram of a buffer of the VCO illustrated in FIG. 19.

FIG. 20 is a circuit diagram of a buffer illustrated in FIG. 19. The structure and the operation of the buffers 321 through 324 are substantially the same as one another, and therefore, the structure and the operation of the fourth buffer 324 only will be described for in the sake of convenience and clarity of the description.

The buffer 324 includes a plurality of transistors P1 through P4 and N2 through N5. The transistors P1 and P2 are connected in parallel with each other between the supply voltage and a positive output node OUTP. The transistors P3 and P4 are connected in parallel with each other between the supply voltage and a negative output node OUTN. The transistors N4 and N2 are connected in series with each other between the positive output node OUTP and ground. The transistors N5 and N3 are connected in series with each other between the negative output node OUTN and ground. The gate of each of the transistors P1 and N2 is connected to a negative input node INN and the gate of each of the transistors P4 and N3 is connected to a positive input node INP.

When the level of the control voltage VCTRL increases, the frequency of the multiphase output oscillation signal FDCO[0:7] also increases. When the level of the control voltage VCTRL decreases, the frequency of the multiphase output oscillation signal FDCO[0:7] also decreases.

Referring back to FIG. 4, the main divider 250 may be implemented by a dual modulus divider or a dual modulus prescaler. A (N+1)/N divider 253 of the main divider 250 may divide the frequency of the DCO clock signal FDCO by (N+1) or N to generate the clock signal FAP and a P divider 251 may divide the clock signal FAP by P to generate the feedback signal FEED. An output signal RST of the P divider 251 is divided by S by an S divider 252. A 1/S frequency-divided clock signal MOD may be used as a selection signal for selecting (N+1) or N as a division factor.

The post divider 260 may divide the output oscillation signal FDCO of the DCO 230 by a division factor and generate the output clock signal FOUT.

The DSM module 280 generates a 1-bit or multi-bit signal having an input value as a mean. The DSM module 280 shapes noise which occurs when the DSM module 280 generates the 1-bit or multi-bit signal so that low noise is generated in a low frequency range and high noise is generated in a high frequency range. The DPLL 200, which operates in a closed loop, has the characteristics of a low-pass filter, and therefore, the high noise generated by the DSM module 280 in the high frequency range is removed or attenuated due to the low-pass filter characteristics of the DPLL 200.

The DSM module 280 receives an integer M of at least 1 and a real number K and outputs a division control signal M_DIV. M and K may be the integer part and the fractional part, respectively, of the division factor L (which is a real number) of the main divider 250. For clarity of the description, M denotes an integer division factor and K denotes a fractional or decimal division factor. For instance, when the division factor L of the main divider 250 is 100.5, M is 100 and K is 0.5 or ½.

In the example above, when M is 100 and K is 0.5, the DSM module 280 may output the division control signal M_DIV having a 1:1 ratio of a value of 100 to a value of 101 so that the mean of the division control signal M_DIV is 100.5. At this time, the values 100 and 101 are randomized.

Figure 21:
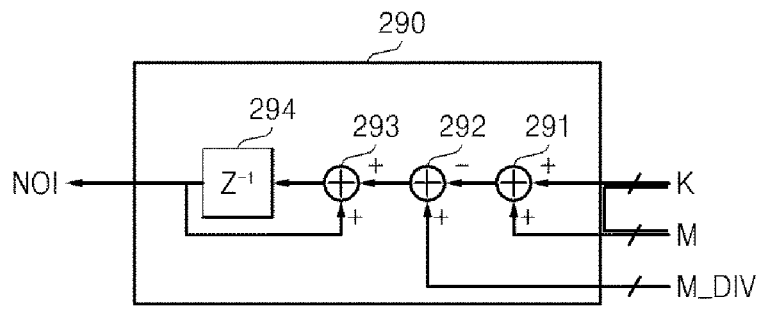
FIG. 21 is a circuit diagram of a delta-sigma modulation (DSM) noise canceller of the DPLL illustrated in FIG. 4.

FIG. 21 is a circuit diagram of the DSM noise canceller 290 of the DPLL illustrated in FIG. 4. Referring to FIGS. 4 and 21, the DSM noise canceller 290 calculates a value, i.e., the DSM noise value NOI corresponding to noise generated by the DSM module 280, used to generate the fractional division factor K in the division factor L and feeds the DSM noise value NOI back to the DLF 220. For this operation, the DSM noise canceller 290 includes an adder 291, a subtractor 292, an integrator 293, and a delay element 294. The adder 291 adds the integer division factor M and the fractional division factor K. The subtractor 292 subtracts an output signal of the adder 291 from the division control signal M_DIV. In other words, the subtractor 292 calculates a difference between the division control signal M_DIV and the output signal of the adder 291. The integrator 293 integrates an output signal of the subtractor 292 and the DSM noise value NOI. The delay element 294 generates the DSM noise value NOI based on the integration result. The delay element 294 may be implemented by a flip-flop.

Figure 22:
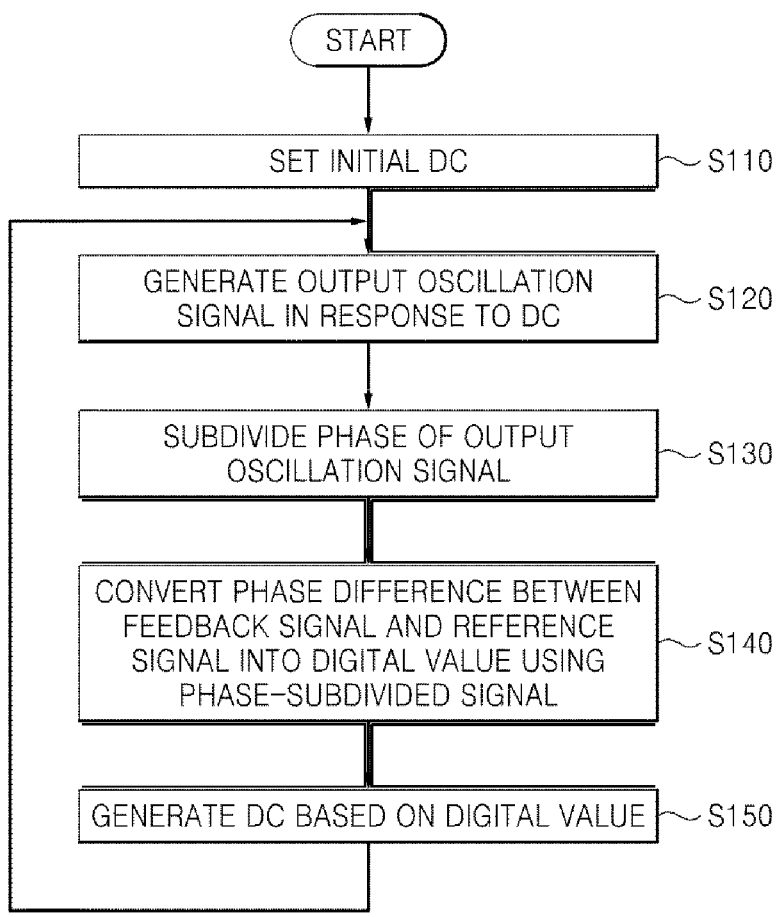
FIG. 22 is a flowchart of a method of operating a DPLL according to an exemplary embodiment.

FIG. 22 is a flowchart of a method of operating a DPLL according to an exemplary embodiment. The method illustrated in FIG. 22 may be a method of operating the DPLL in a fine frequency tuning mode.

Referring to FIGS. 1 through 22, the digital control code DC may be set to an initial value (e.g., a default value) in operation S110 before the DPLL 200 is operated in the fine frequency tuning mode. In the fine frequency tuning mode, the DCO 230 outputs the output oscillation signal FDCO in response to the digital control code DC in operation S120. The PDC 240 subdivides the phase of the output oscillation signal FDCO in operation S130. The PDC 240 converts a phase difference between the first feedback signal FEED and the reference signal FIN into a digital value using a phase-subdivided signal (e.g., a 32-phase signal) in operation S140. The PDC 240 may obtain the phase difference between the first feedback signal FEED and the reference signal FIN by calculating a phase difference between the reference signal FIN and the second feedback signal FEED_PRE, which has a phase difference from the first feedback signal FEED, instead of directly calculating the phase difference between the first feedback signal FEED and the reference signal FIN. The first feedback signal FEED is a result of dividing the output oscillation signal FDCO by a division factor using the main divider 250. The main divider 250 may divide the output oscillation signal FDCO in response to the division control signal M_DIV output from the DSM module 280. The phase difference and the division factor may each be predetermined.

The DLF 220 filters the digital value output from the PDC 240 and applies a filtering result to the DC generator 270. The DC generator 270 generates the digital control code DC based on the output of the DLF 220 in operation S150. The digital control code DC is applied to the DCO 230 and operations S120 through S150 are repeated.

Figure 23:
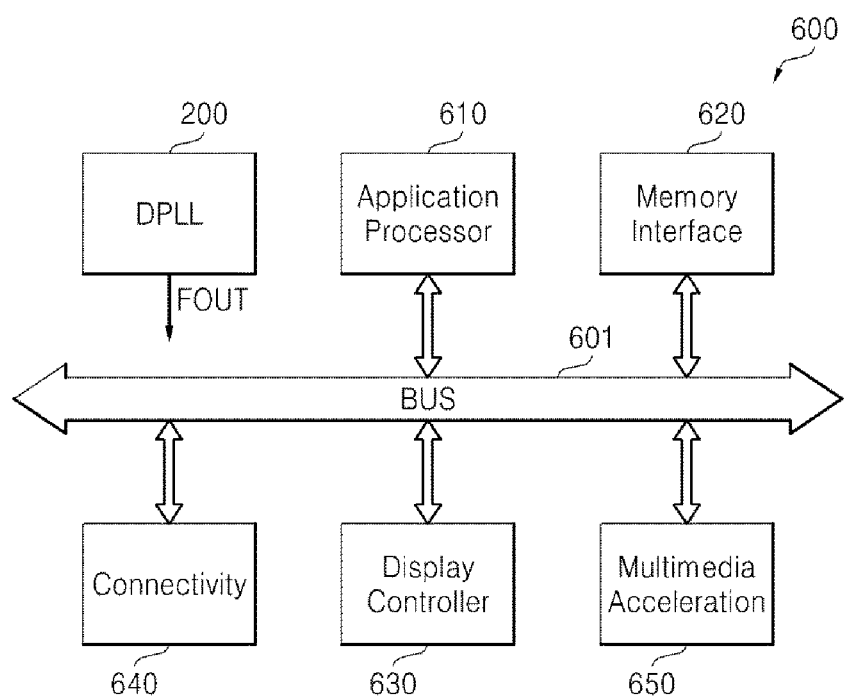
FIG. 23 is a block diagram of a portable electronic device including a DPLL according to an exemplary embodiment.

FIG. 23 is a block diagram of a portable electronic device including a DPLL according to an exemplary embodiment. Referring to FIGS. 1 through 23, a portable electronic device 600 includes the DPLL 200, an application processor 610, a memory interface 620, a display controller 630, connectivity 640, and multimedia acceleration 650. The portable electronic device 600 may be, for example, a laptop computer, a mobile telephone, a smart phone, a personal computer (PC), a tablet PC, a personal digital assistant (PDA), an enterprise digital assistant (EDA), a digital still camera, a digital video camera, a portable multimedia player (PMP), a personal navigation device or portable navigation device (PND), a handheld game console, or an e-book, etc.

The application processor 610 may control the memory interface 620, the display controller 630, the connectivity 640, and the multimedia acceleration 650 through a bus 601. The memory interface 620 may include an embedded memory device and/or a memory controller that interfaces with an external memory device. The display controller 630 may transmit data to be displayed on a display to the display.

The connectivity 640 may include general purpose input/output (GPIO) interface, a serial peripheral interface (SPI) bus, and/or a universal serial bus (USB) on-the-go (OTG), etc. The multimedia acceleration 650 may include camera interface, multi-format codec, video pre/post processor, and/or JPEG, etc.

A related art DPLL based on a time-to-digital converter (TDC) is disadvantageous in terms of area and power consumption. By contrast, a DPLL based on a PDC according to exemplary embodiments is more advantageous than the TDC-based DPLL in terms of area and power consumption.

As described above, according to one or more exemplary embodiments, a DPLL is structured using a PDC more advantageous than a TDC in terms of area and power consumption, so that the PDC-based DPLL is more advantageous than the related art TDC-based DPLL. Therefore, a DPLL circuit according to one or more exemplary embodiments is operated in a small area and with low power consumption. In addition, according to one or more exemplary embodiments, the DPLL divides an output oscillation signal by a real-number division factor, thereby removing noise and improving noise characteristics.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A digital phase locked loop comprising:
a digitally-controlled oscillator configured to change a frequency and a phase of an output oscillation signal in response to a digital control code;
a main divider configured to divide the frequency of the output oscillation signal and generate a first feedback signal based on the divided frequency; and
a phase-to-digital converter configured to receive the output oscillation signal from the digitally-controller oscillator, to subdivide the phase of the output oscillation signal into a plurality of phase components, and to generate a quantized code by converting a phase difference between a reference signal and the first feedback signal using the phase components resulting from the subdivision,
wherein the digital control code is generated based on the quantized code.

2. The digital phase locked loop of claim 1, wherein the phase-to-digital converter comprises:
a phase interpolator configured to subdivide the phase of the output oscillation signal and generate the plurality of phase components having phases different from each other;
a phase quantizer configured to count at least one of a rising edge and a falling edge of each of the phase components in response to a quantizer control signal and to generate the quantized code based on a count value resulting from the counting; and
a deadzone-free phase-frequency detector configured to generate the quantizer control signal for controlling an operation of the phase quantizer.

3. The digital phase locked loop of claim 2, wherein the phase quantizer comprises:
a plurality of counters, each of the plurality of counters configured to count edges of one of the phase components between an edge of a second feedback signal and an edge of the reference signal;
an adder configured to determine an added count value by adding outputs of the respective counters; and
a differentiator configured to generate the quantized code by determining a difference between the added count value and a reference count value, and
the second feedback signal has a first phase difference from the first feedback signal.

4. The digital phase locked loop of claim 3, wherein the reference count value represents the first phase difference between the second feedback signal and the first feedback signal.

5. The digital phase locked loop of claim 3, wherein the deadzone-free phase-frequency detector is configured to start a counting operation of the counters in response to the first feedback signal and stop the counting operation in response to the reference signal.

6. The digital phase locked loop of claim 5, wherein the deadzone-free phase-frequency detector is configured to reset the counters in response to a third feedback signal and the third feedback signal has a second phase difference from the first feedback signal.

7. The digital phase locked loop of claim 1, further comprising:
a digital loop filter configured to receive and filter the quantized code; and
a digital code generator configured to generate the digital control code based on an output signal of the digital loop filter.

8. The digital phase locked loop of claim 7, further comprising a delta-sigma modulation (DSM) module configured to generate a division control signal using a real-number division factor,
wherein the real-number division factor comprises an integer division factor and a fractional division factor, and the main divider divides the frequency of the output oscillation signal according to the division control signal.

9. The digital phase locked loop of claim 8, further comprising a DSM noise canceller configured to remove DSM noise from the quantized code,
wherein the DSM noise corresponds to a difference between an actual division factor of the main divider based on the division control signal and the real-number division factor.

10. The digital phase locked loop of claim 1, further comprising an automatic frequency controller configured to compare the reference signal with the first feedback signal and to generate a coarse control code so that the first feedback signal has a frequency approximating to a frequency of the reference signal,
wherein the digitally-controlled oscillator changes the phase and the frequency of the output oscillation signal in response to the coarse control code.

11. A method of operating a digital phase locked loop, the method comprising:
generating a first feedback signal by dividing a frequency of an output oscillation signal;
generating phase-subdivided output signals by subdividing a phase of the output oscillation signal into a plurality of phase components;
generating a quantized code by converting a phase difference between a reference signal and the first feedback signal using the phase components;
generating a digital control code based on the quantized code; and
changing the frequency and the phase of the output oscillation signal based on the digital control code.

12. The method of claim 11, further comprising generating a second feedback signal that has a same frequency as the first feedback signal and has a first phase difference from the first feedback signal,
wherein the generating the quantized code further comprises:
determining a phase difference between the second feedback signal and the reference signal; and
determining the phase difference between the reference signal and the first feedback signal using the phase difference between the second feedback signal and the reference signal and the first phase difference.

13. The method of claim 12, wherein the generating the phase-subdivided output signals comprises interpolating the phase components.

14. The method of claim 13, wherein the determining the phase difference between the second feedback signal and the reference signal comprises:
counting at least one of a rising edge and a falling edge of each of the interpolated phase components in response to a quantizer control signal, which is enabled in response to the second feedback signal and is disabled in response to the reference signal,
adding the counts of each of the phase-interpolated output signals to produce an added count value, and
outputting the added count value.

15. The method of claim 14, wherein the first phase difference corresponds to a reference count value obtained by counting at least one of the rising edge and the falling edge of each of the interpolated phase components occurring between the second feedback signal and the first feedback signal.

16. The method of claim 15, wherein the determining the phase difference between the second feedback signal and the reference signal comprises determining a difference between the added count value and the reference count value.

17. The method of claim 11, wherein the generating the first feedback signal comprises:
generating a division control signal based on a real-number division factor; and
dividing the frequency of the output oscillation signal according to the division control signal, and
wherein the real-number division factor comprises an integer division factor and a fractional division factor.

18. A digital phase locked loop comprising:
a digitally-controlled oscillator configured to generate an oscillation signal having a plurality of phases, in response to a quantized code;
a main divider configured to divide a frequency of the oscillation signal by a division factor to generate a first feedback signal; and
a phase-to-digital converter configured to generate the quantized code using a reference signal, the first feedback signal, and the plurality of phases of the oscillation signal,
wherein the phase-to-digital converter is configured to generate the quantized code by subdividing the phases of the oscillation signal into a plurality of phase components, and quantizing a phase difference between the reference signal and the first feedback signal using the subdivided phase components.

19. The digital phase locked loop according to claim 18, wherein the main divider is configured to generate a second feedback signal having a first phase difference from the first feedback signal, and a third feedback signal having a second phase difference from the first feedback signal, and
the phase-to-digital converter is configured to generate the quantized code by subdividing the phases of the oscillation signal into a plurality of phase components, and quantizing a phase difference between the reference signal and the first feedback signal using the subdivided phase components, the second feedback signal and the third feedback signal.

* * * * *